United States Patent
Ng et al.

(10) Patent No.: US 9,303,318 B2
(45) Date of Patent: Apr. 5, 2016

(54) MULTIPLE COMPLEMENTARY GAS DISTRIBUTION ASSEMBLIES

(71) Applicant: Applied Materials, Inc., Santa Clara, CA (US)

(72) Inventors: Tuoh-Bin Ng, San Jose, CA (US); Yuriy Melnik, San Jose, CA (US); Lily L Pang, Fremont, CA (US); Eda Tuncel, Menlo Park, CA (US); Lu Chen, Cupertino, CA (US); Son T Nguyen, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 371 days.

(21) Appl. No.: 13/649,488

(22) Filed: Oct. 11, 2012

(65) Prior Publication Data

US 2013/0098455 A1    Apr. 25, 2013

Related U.S. Application Data

(60) Provisional application No. 61/549,694, filed on Oct. 20, 2011.

(51) Int. Cl.
    *C23C 16/455* (2006.01)
    *C23C 16/30* (2006.01)
    *C23C 16/448* (2006.01)

(52) U.S. Cl.
    CPC ........... *C23C 16/303* (2013.01); *C23C 16/4488* (2013.01); *C23C 16/4558* (2013.01); *C23C 16/45574* (2013.01); *Y10T 137/0318* (2015.04); *Y10T 137/8593* (2015.04)

(58) Field of Classification Search
    CPC ..................................................... C23C 16/455
    USPC ................ 137/561 A; 118/715, 720
    See application file for complete search history.

(56) References Cited

U.S. PATENT DOCUMENTS 5,993,557 A * 11/1999 Tomita et al. ............... 118/730
6,274,495 B1 * 8/2001 Omstead et al. ............. 438/680

(Continued)

FOREIGN PATENT DOCUMENTS

| KR | 10-0484945 B1 | 4/2005 |
| KR | 10-0791995 B1 | 1/2008 |
| KR | 10-1026058 B1 | 4/2011 |

OTHER PUBLICATIONS

PCT Notification of Transmittal of the International Search Report and the Written Opinion of the International Searching Authority, or the Declaration for International Application No. PCT/US2012/060104, filed Oct. 12, 2012, mailing date Mar. 29, 2013, (11 pages).

(Continued)

*Primary Examiner* — John K Fristoe, Jr.
*Assistant Examiner* — Christopher Ballman
(74) *Attorney, Agent, or Firm* — Blakely, Sokoloff, Taylor & Zafman LLP

(57) ABSTRACT

In one embodiment, an apparatus includes a first gas distribution assembly that includes a first gas passage for introducing a first process gas into a second gas passage that introduces the first process gas into a processing chamber and a second gas distribution assembly that includes a third gas passage for introducing a second process gas into a fourth gas passage that introduces the second process gas into the processing chamber. The first and second gas distribution assemblies are each adapted to be coupled to at least one chamber wall of the processing chamber. The first gas passage is shaped as a first ring positioned within the processing chamber above the second gas passage that is shaped as a second ring positioned within the processing chamber. The gas distribution assemblies may be designed to have complementary characteristic radial film growth rate profiles.

19 Claims, 15 Drawing Sheets

(56) References Cited

U.S. PATENT DOCUMENTS

| | | | |
|---|---|---|---|
| 6,921,437 B1* | 7/2005 | DeDontney et al. | 118/715 |
| 2001/0050059 A1* | 12/2001 | Hongo et al. | 118/723 MW |
| 2002/0164423 A1* | 11/2002 | Chiang et al. | 427/255.28 |
| 2004/0026038 A1 | 2/2004 | Yoshida | |
| 2006/0021568 A1* | 2/2006 | Matsumoto | 118/62 |
| 2006/0060143 A1 | 3/2006 | Lee et al. | |
| 2006/0162661 A1* | 7/2006 | Jung et al. | 118/723 ER |
| 2007/0087296 A1 | 4/2007 | Kim et al. | |
| 2007/0221129 A1* | 9/2007 | Bae et al. | 118/715 |
| 2007/0274822 A1* | 11/2007 | Liu et al. | 415/90 |
| 2008/0185104 A1* | 8/2008 | Brcka | 156/345.29 |
| 2008/0314311 A1 | 12/2008 | Burrows et al. | |
| 2010/0258049 A1 | 10/2010 | Ishikawa et al. | |
| 2010/0258052 A1* | 10/2010 | Ishikawa et al. | 118/715 |
| 2011/0052833 A1* | 3/2011 | Hanawa et al. | 427/534 |
| 2011/0230008 A1* | 9/2011 | Lakshmanan et al. | 438/96 |
| 2012/0122302 A1* | 5/2012 | Weidman et al. | 438/478 |

OTHER PUBLICATIONS

PCT International Preliminary Report on Patentability (Chapter 1) for International Application No. PCT/US2012/060104, filing date Oct. 12, 2012, mailing date Apr. 22, 2014, (8 pages).

\* cited by examiner

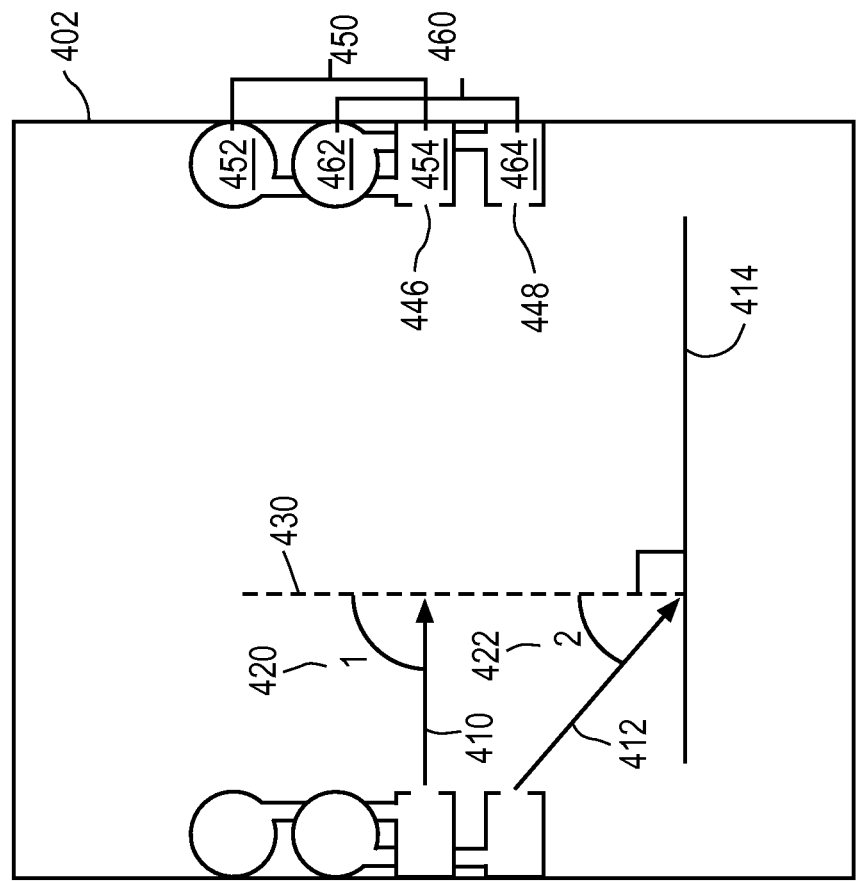
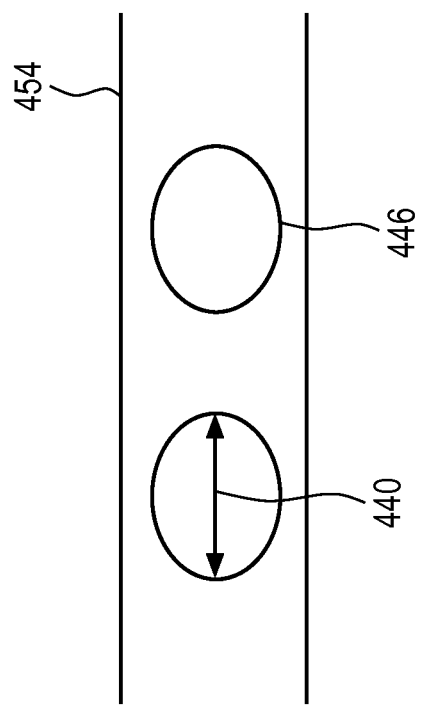
FIG. 4a
FIG. 4b

Increasing showerhead gas flow rate

Orifice pattern around sidewall distribution assembly:
1002 — ( 1 1 2 3 4  2 1 2 3 4  1 1 2 3 4  3 1 2 3 4 ) × 3
• Total 60 holes: 18× $_1$ / 15× $_2$ / 15× $_3$ / 12× $_4$

MULTIPLE COMPLEMENTARY GAS DISTRIBUTION ASSEMBLIES

RELATED APPLICATIONS

This application claims the benefit of Provisional Application No. 61/549,694, filed Oct. 20, 2011, which is incorporated herein by reference. This application is related to the following commonly-owned, application Ser. No. 12/637,019, filed Dec. 14, 2009, entitled "HVPE Chamber Hardware", which has published as U.S. 2010/0258049.

The United States Government has rights in this invention pursuant to Contract No. DE-EE0003331 between the United States Department of Energy and Applied Materials, Inc.

FIELD

This present disclosure relates to multiple complementary sidewall gas distribution assemblies that are coupled to a processing chamber.

BACKGROUND

Group-III Nitrides such as GaN, AlN and AlGaN alloys are very important materials in the fabrication of optoelectronics (e.g. solid state lighting), laser diodes, and high power electronics. One method used to deposit Group-III nitride films is hydride vapor phase epitaxy (HVPE). In conventional HVPE, a gaseous hydrogen halide or halogen reacts with the Group-III metal to create a metal halide which then reacts with a nitrogen precursor to form the Group-III metal nitride. The reaction typically involves the high temperature vapor phase reaction between one or more metallic chlorides and ammonia ($NH_3$). HVPE has significant advantages over other deposition methods. These advantages include high film growth rates, excellent material characteristics, flexible growth conditions, good reproducibility, simplicity in hardware and low cost of ownership. However, one of the difficulties with HVPE is achieving good within-chamber thickness uniformity of the Group-III nitride film.

SUMMARY

Described herein are exemplary apparatuses for depositing semiconductor films on substrates. In one embodiment, the processing apparatus (e.g., a hydride vapor phase epitaxy apparatus) includes a chamber with at least one chamber wall and two or more gas distribution assemblies attached to at least one chamber wall. Each gas distribution assembly is coupled to one or more gas sources and each gas distribution assembly has orifices through which one or more gases flow into the chamber and react to deposit semiconductor films.

In an embodiment, an apparatus includes multiple gas distribution assemblies. Each gas distribution assembly includes a first gas passage and a second gas passage. Each gas distribution assembly is adapted to be coupled to a processing chamber. Each of the second gas passages includes orifices to introduce one or more process gases into the processing chamber.

BRIEF DESCRIPTION OF THE DRAWINGS

Embodiments of the present disclosure is illustrated by way of example, and not by way of limitation, in the figures of the accompanying drawings, in which:

FIG. 4a shows part of a gas passage 454 of a sidewall gas distribution assembly according to one embodiment with orifices 446 having an orifice diameter 440.

FIG. 4b illustrates a processing apparatus 400 (e.g., an HVPE apparatus, a hot-wall chemical vapor deposition apparatus) with two sidewall gas distribution assemblies 450, 460 according to one embodiment.

DETAILED DESCRIPTION

Figure 1:
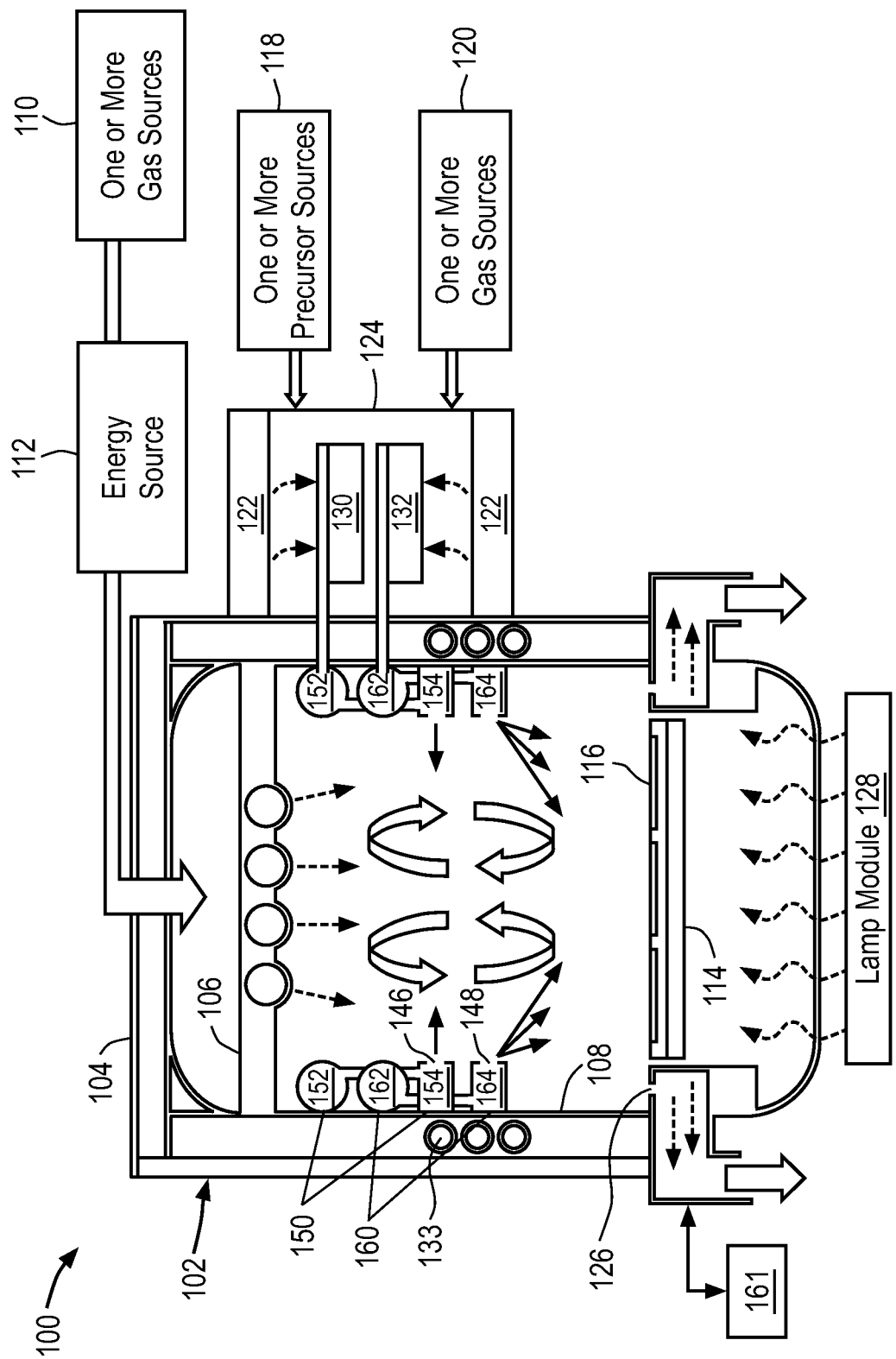
FIG. 1 is a schematic cross-sectional side view of a processing apparatus (e.g., HVPE apparatus) in accordance with one embodiment.

In the following description, numerous details are set forth. It will be apparent, however, to one skilled in the art, that the present invention may be practiced without these specific details. In some instances, well-known methods and devices are shown in block diagram form, rather than in detail, to avoid obscuring the present invention. Reference throughout this specification to "an embodiment" means that a particular feature, structure, function, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, functions, or characteristics may be combined in any suitable manner in one or more embodiments. For example, a first embodiment may be combined with a second embodiment anywhere the two embodiments are not mutually exclusive.

In one embodiment, a processing apparatus (e.g., hydride vapor phase epitaxy apparatus, hot wall chemical vapor deposition apparatus) for depositing films on substrates with improved thickness uniformity is disclosed. The apparatus includes a chamber with at least one chamber wall and two or more sidewall gas distribution assemblies attached to at least one chamber wall. Each gas distribution assembly is coupled to at least one process gas source and each gas distribution assembly has orifices through which at least one process gas is introduced into the chamber. A previous approach for depositing a film by hydride vapor phase epitaxy (HVPE) uses a processing apparatus with only one sidewall gas distribution assembly. One of the drawbacks of a processing apparatus with only one sidewall gas distribution assembly is poor radial film growth rate uniformity across the susceptor. Every sidewall gas distribution assembly has a characteristic radial film growth rate profile produced under a given process condition that is within the process window where desirable film properties are obtained. The characteristic radial film growth rate profile of a given sidewall gas distribution assembly is typically non-uniform with growth rates that are either faster at the center (center-fast) or faster at the edge (edge-fast) of the susceptor. A processing apparatus with only one sidewall gas distribution assembly also suffers from inflexibility and limited tuneability because the orifices on the sidewall gas distribution assembly all experience the same gas supply pressure by virtue of the orifices sharing the same sidewall gas distribution assembly. The gases that emerge from each of the orifices on the sidewall gas distribution assembly are automatically equalized to the same velocity regardless of the size and orientation of the orifices or the number of orifices.

In one embodiment with two or more sidewall gas distribution assemblies, each sidewall gas distribution assembly may be designed to have different but complementary characteristic radial film growth rate profiles. The two or more sidewall gas distribution assemblies with complementary characteristic radial film growth rate profiles may together produce a net characteristic radial film growth rate profile that is approximately uniform across the susceptor. For example, a chamber may have two sidewall gas distribution assemblies where each has a characteristic radial film growth rate profile that is linear but in opposite directions (i.e., one center-fast and the other edge-fast). In such a case, a uniform film growth rate profile may be obtained by operating the two sidewall gas distribution assemblies together or in sequence. An improvement in film growth rate uniformity across the susceptor improves the within-chamber thickness uniformity of films deposited on the substrates which increases overall product yields.

FIG. 1 is a schematic cross-sectional view of a processing apparatus 100 (e.g., HVPE apparatus, hot wall chemical vapor deposition apparatus) in one embodiment. The apparatus 100 includes a chamber 102 having at least one chamber wall 108 and is enclosed by a lid 104. The apparatus includes an integrated system controller 161 or is communicatively coupled to the system controller. A gas distribution showerhead 106 is disposed at one end of the chamber 102 and a susceptor 114 is disposed at the other end of the chamber 102. The susceptor 114 may be rotatable. One or more process gases from one or more gas sources 110 is delivered into the chamber 102 through the gas distribution showerhead 106. In one embodiment, the gas source 110 may include a nitrogen containing compound (e.g., nitrogen gas, nitrous oxide, ammonia, hydrazine, diimide, hydrazoic acid, etc.). In one embodiment, an inert gas (e.g., helium, argon, diatomic nitrogen, etc.) may be introduced as well either through the gas distribution showerhead 106 or through the walls 108 of the chamber 102. An energy source 112 such as a heater may be disposed between the gas source 110 and the gas distribution showerhead 106. The energy source 112 may break up the gas from the gas source 110 so that the nitrogen from the nitrogen containing gas is more reactive.

Two sidewall gas distribution assemblies 150 and 160 are coupled to at least one chamber wall 108 and are disposed between the gas distribution showerhead 106 and the susceptor 114. In an alternative embodiment, the chamber may contain more than two sidewall gas distribution assemblies. The assembly 150 includes a gas passage 152 coupled to another gas passage 154, which has orifices 146. The assembly 160 includes a gas passage 162 coupled to another gas passage 164, which has orifices 148. Each sidewall gas distribution assembly is coupled to one or more gas sources and has orifices 146, 148 through which gases may be introduced into the chamber 102. In one embodiment, the first sidewall gas distribution assembly 150 is coupled to one or more precursor sources 118 (e.g., Ga, Al, etc) and may introduce one or more precursor containing gases (e.g., metal halide, GaCl, GaCl3, AlCl, AlCl3, AlBr3, AlI, AlI3, etc.) into the chamber 102. The second gas distribution assembly 160 is coupled to one or more gas sources 120 and may introduce one or more inert gases (e.g., helium, argon, diatomic nitrogen, etc.) into the chamber 102. In another embodiment, each sidewall gas distribution assembly may be coupled to any one or combination of precursor sources, reactive gas sources, or inert gas sources. Two or more sidewall gas distribution assemblies may each introduce different gases into the chamber from different sources. Two or more sidewall gas distribution assemblies may also each introduce the same gases into the chamber from the same sources.

The precursor source may be a separate reaction vessel in which a reactive gas (e.g., halogen containing gas, Cl2, HCl, Br2, HBr, I2, HI, etc.) may be introduced to react with the precursor (e.g., Ga, Al, etc) to form a precursor containing gas (e.g., metal halides, GaCl, GaCl3, AlCl, AlCl3, AlBr3, AlI, AlI3, etc.) that is delivered into the chamber through one or more sidewall gas distribution assemblies. The precursor may be in a solid or a liquid state. The reactivity of the reactive gas with the precursor may be enhanced by snaking the reactive gas through the chamber 124 past a resistive heater 122 to increase its temperature.

In an embodiment, to react with the gas from the source 110, precursor material may be delivered from one or more precursor sources 118. The one or more precursor sources 118 may include precursors such as gallium and aluminum. It is to be understood that while reference will be made to two precursors, more or less precursors may be delivered as discussed above. In one embodiment, the precursor includes gallium present in the precursor source 118 in liquid form. In another embodiment, the precursor includes aluminum present in the precursor source 118 in solid form. In one embodiment, the aluminum precursor may be in solid, powder form. The precursor may be delivered to the chamber 102 by flowing a reactive gas over and/or through the precursor in the precursor source 118. In one embodiment, the reactive gas may include a chlorine containing gas such as diatomic chlorine. The chlorine containing gas may react with the precursor source such as gallium or aluminum to form a chloride. In one embodiment, the one or more sources 118 may include eutectic materials and their alloys. In another embodiment, the HVPE apparatus 100 may be arranged to handle doped sources as well as at least one intrinsic source to control the dopant concentration.

In order to increase the effectiveness of the chlorine containing gas to react with the precursor, the chlorine containing gas may optionally snake through the boat area in the chamber 124 and be heated with the resistive heater 122. By increasing the residence time that the chlorine containing gas is snaked through the chamber 124, the temperature of the chlorine containing gas may be controlled. By increasing the temperature of the chlorine containing gas, the chlorine may react with the precursor faster. In other words, the temperature is a catalyst to the reaction between the chlorine and the precursor.

In order to increase the reactiveness of the precursor, the precursor may be heated by a resistive heater 122 within the chamber 124 in an optional boat 130 or 132. For example, in one embodiment, the gallium precursor may be heated to a temperature of between about 750 degrees Celsius to about 850 degrees Celsius. The chloride reaction product may then be delivered to the chamber 102 via boat 130 and gas distribution assembly 150. The reactive chloride product first enters a gas passage 152 where it evenly distributes within the gas passage 152. The gas passage 152 is connected to another gas passage 154. The chloride reaction product enters the gas passage 154 after it has been evenly distributed within the gas passage 152. The chloride reaction product then enters into the chamber 102 where it mixes with the nitrogen containing gas to form a nitride layer on the substrate 116 that is disposed on a susceptor 114. In one embodiment, the susceptor 114 may include silicon carbide. The nitride layer may include gallium nitride or aluminum nitride for example. The other reaction product, such as nitrogen and chlorine, is exhausted through an exhaust 126.

In an embodiment, the chloride reaction product may be delivered to the chamber 102 via boat 132 and gas distribution assembly 160. The reactive chloride product first enters a gas passage 162 where it evenly distributes within the gas passage 162. The gas passage 162 is connected to another gas passage 164. The chloride reaction product enters the gas passage 164 after it has been evenly distributed within the gas passage 162. The chloride reaction product then enters into the chamber 102 where it mixes with the nitrogen containing gas to form a nitride layer on the substrate 116 that is disposed on a susceptor 114. The one or more gas sources 120 may also be delivered into either of the gas distribution assemblies 150 and 160.

Referring back to FIG. 1, the chamber 102 may have a thermal gradient that can lead to a buoyancy effect. For example, the nitrogen based gas is introduced through the gas distribution showerhead 106 at a temperature between about 450° C. and about 550° C. The chamber walls 108 may have a temperature of about 600° C. to about 700° C. The susceptor 116 may have a temperature of about 1050° C. to about 1150° C. Thus, the temperature difference within the chamber 102 may permit the gas to rise within the chamber 102 as it is heated and then fall as it cools. The rising and falling of the gas may cause the nitrogen gas and the chloride gas to mix. Additionally, the buoyancy effect will reduce the amount of gallium nitride or aluminum nitride that deposits on the walls 108 because of the mixing.

The heating of the processing chamber 102 is accomplished by heating the susceptor 114 with a lamp module 128 that is disposed below the susceptor 114. During deposition, the lamp module 128 is the main source of heat for the processing chamber 102. While shown and described as a lamp module 128, it is to be understood that other heating sources may be used. Additional heating of the processing chamber 102 may be accomplished by use of a heater 133 embedded within the walls 108 of the chamber 102. The heater 133 embedded in the walls 108 may provide little if any heat during the deposition process. A thermocouple may be used to measure the temperature inside the processing chamber. Output from the thermocouple may be fed back to a controller that controls the heating of the heater 133 based upon the reading from the thermocouple. For example, if the chamber is too cool, the heater 133 will be turned on. If the chamber is too hot, the heater 133 will be turned off. Additionally, the amount of heating from the heater 133 may be controlled such that a low amount of heat is provided from the heater 133.

After the deposition process, the one or more substrates 116 are normally taken out of the processing chamber 102. The lamp module 128 is turned off. Without the heat from the lamp module 128, the chamber 102 may rapidly cool. The process gases may condense and deposit onto the walls 108 of the chamber. The deposits may have a different coefficient of thermal expansion than the walls 108 themselves and thus may flake off due to thermal expansion. To prevent undesired flaking, the heater 133 embedded within the chamber walls 108 may be turned on to control the thermal expansion and maintain the chamber 102 at the desired chamber temperature. The control of the heater 133 may again be based upon real time feedback from the thermocouple. Once the lamp module 128 is turned off, the heater 133 may be turned on or up to maintain the temperature of the chamber 102 at the desired temperature so that the deposits on the chamber walls 108 may not flake off and contaminate the substrate or land on the susceptor 114 and create an uneven susceptor 114 surface. By maintaining the chamber walls 108 at an elevated temperature, a cleaning gas, such as chlorine, may be more effective in cleaning the deposits from the chamber walls 108.

Figure 2:
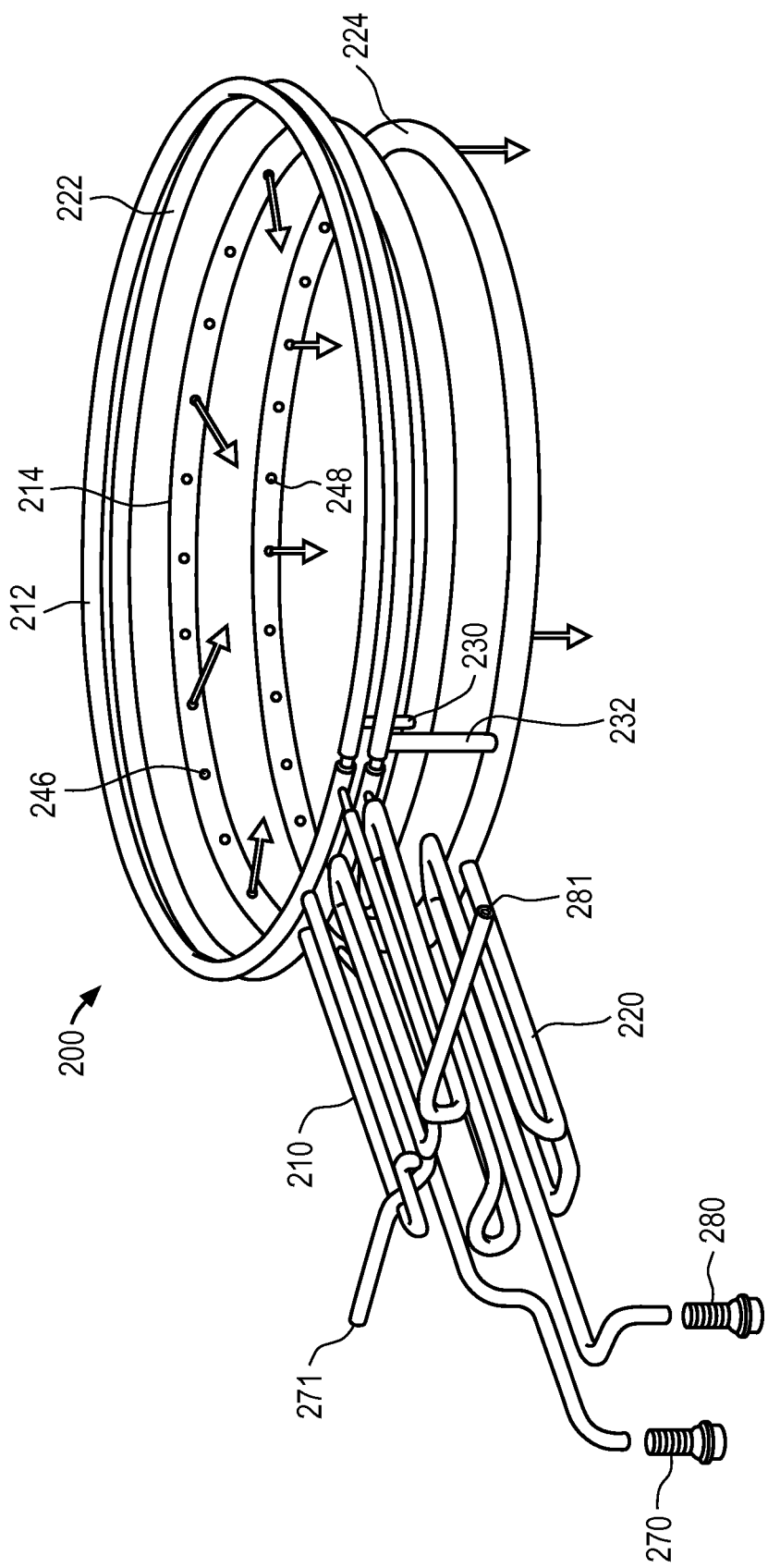
FIG. 2 illustrates an apparatus that includes two sidewall gas distribution assemblies in accordance with one embodiment.

In one embodiment, each sidewall gas distribution assembly may include two or more gas passages. FIG. 2 illustrates an example of an apparatus 200 that includes two sidewall gas distribution assemblies 210 and 220 according to one embodiment. Each sidewall gas distribution assembly may include two gas passages. The sidewall gas distribution assembly 210 has a gas passage 212 coupled to another gas passage 214 via one or more connectors 230. The sidewall gas distribution assembly 220 has a gas passage 222 coupled to another gas passage 224 via one or more connectors 232. The gas passages 212, 214, 222, and 224 may each be tubes that are shaped in circular rings. The gas passage 212 may be coupled to one or more gas sources via inlet 270 and a reaction product via inlet 271 that is coupled to a boat (e.g., boat 130). The gas passage 222 may be coupled to one or more gas sources via inlet 280 and a reaction product via inlet 281 that is coupled to a boat (e.g., boat 132). The one or more connectors 230, 232 may be arranged to substantially balance the flow of gases between the coupled gas passages. In one embodiment, the connectors may be substantially identical. In another embodiment, at least one connector may be different from at least one other connector. The connectors may be uniformly distributed between the coupled gas passages. In another embodiment, the connectors may be non-uniformly distributed between the coupled gas passages. One or more process gases from one or more gas sources may flow into the gas passages 212 and 222 and evenly distribute within the gas passages 212 and 222. The process gases may enter into the gas passages 214 and 224 from the respective gas passages 212 and 222 through the respective connectors 230 and 232 after the process gases have been evenly distributed within the gas passages 212 and 222. The process gases may then enter into the chamber through orifices 246 and 248 on the gas passages 214 and 224.

Figure 3:
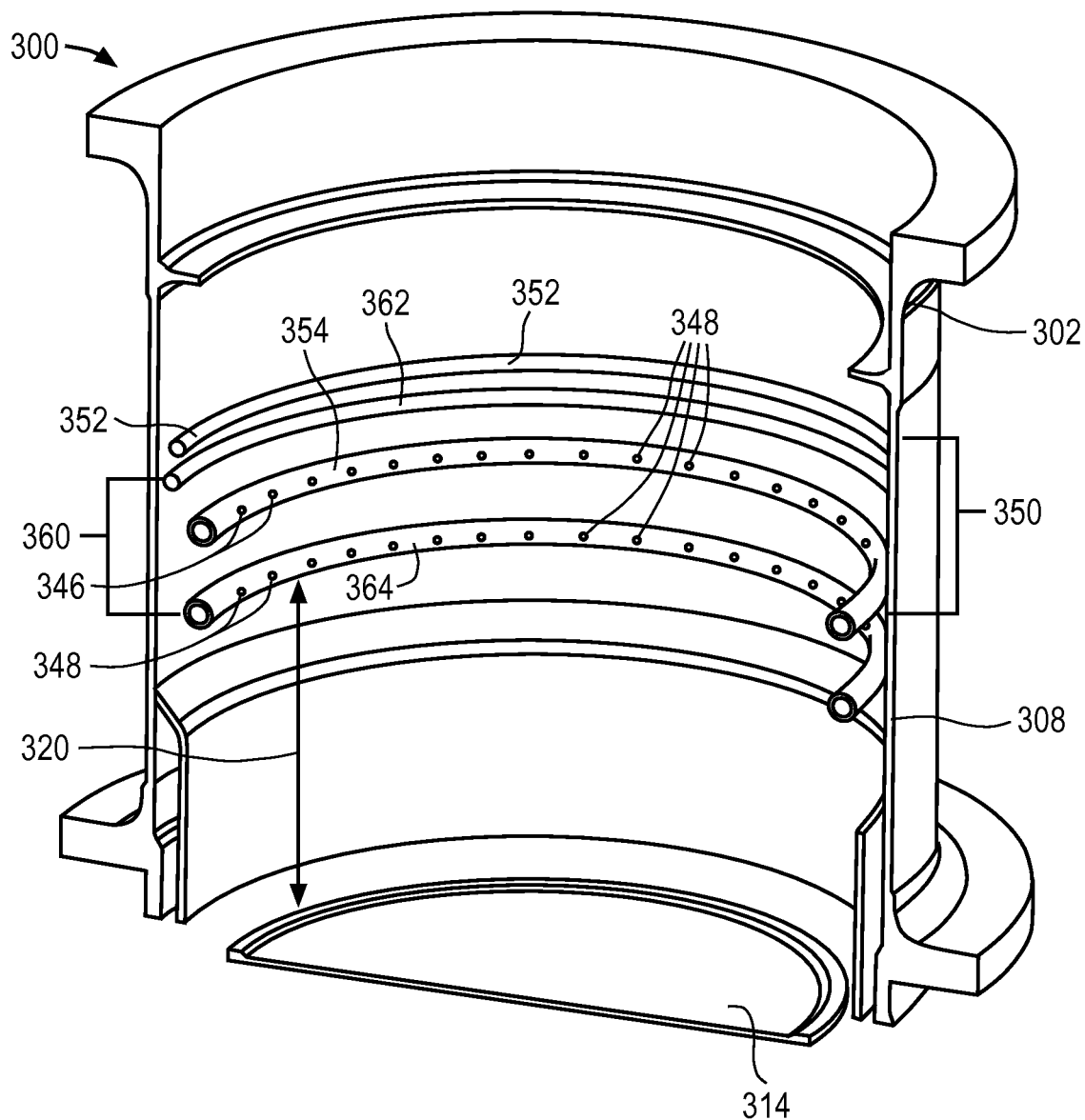
FIG. 3 is a cross-sectional side view of a processing apparatus showing two sidewall gas distribution assemblies disposed within the processing apparatus in accordance with one embodiment.

FIG. 3 of the drawings shows a processing apparatus 300 (e.g., HVPE apparatus 100, hot-wall chemical vapor deposition apparatus) with two sidewall gas distribution assemblies 350, 360 disposed along the chamber wall 308 above the susceptor 314 according to one embodiment. Sidewall gas distribution assembly 350 includes a gas passage 352 coupled to another gas passage 354. The other sidewall gas distribution assembly 360 includes a gas passage 362 coupled to another gas passage 364. The gas passages 352 and 362 are attached to at least one chamber wall 308 and the gas passages 352 and 362 are disposed above the gas passages 354 and 364. The distance 320 between the gas passage 364 and the susceptor 314 varies based on the dimensions of the chamber. In one embodiment, the distance 320 may range from 186.9 mm to 201.5 mm. Process gases from the sidewall gas distribution assemblies 350 and 360 may flow into the chamber 302 through the orifices 346 and 348 of the gas passages 354 and 364. In one embodiment, the orifices 346 and 348 may be uniformly distributed across the respective gas passages 354 and 364. In another embodiment, the orifices 346 and 348 may be non-uniformly distributed across the gas passages 354 and 364.

Each orifice on the sidewall gas distribution assemblies may have multiple orifice characteristics. One orifice characteristic may include an orifice diameter. FIG. 4a shows part of a gas passage 454 of a sidewall gas distribution assembly according to one embodiment with orifices 446 having an orifice diameter 440. The orifice diameter may limit the velocity of the process gases flowing through the orifices into the chamber. In one embodiment, the orifices of one or more sidewall gas distribution assemblies may all have the same orifice diameters. In another embodiment, the orifices of one or more sidewall gas distribution assemblies may have several different orifice diameters. Another orifice characteristic may include an orifice orientation. The orifice orientation may direct process gases from the sidewall gas distribution assemblies 450 and 460 into the chamber 402 and towards the susceptor 414 at a specific angle. FIG. 4b illustrates a processing chamber 402 of a processing apparatus (e.g., a HVPE apparatus, a hot-wall chemical vapor deposition apparatus) with two sidewall gas distribution assemblies 450 and 460 according to one embodiment. The orifices 446 and 448 of the sidewall gas distribution assemblies have orifice orientations that direct the flow of process gases 410 and 412 into the chamber 402 at angles 420 and 422 relative to a reference line 430 that is normal to the susceptor 414. In one embodiment, the orifices of one or more sidewall gas distribution assemblies may all have the same orifice orientation directing process gases at the same angle. In another embodiment, the orifices of one or more sidewall gas distribution assemblies may have different orifice orientations directing process gases at several different angles.

Each sidewall gas distribution assembly may have a different number of orifices and may have orifices with a different combination of orifice characteristics. For example, one or more sidewall gas distribution assemblies may have 48 orifices while one or more other sidewall gas distribution assemblies in the same chamber may have 60 orifices. One or more sidewall gas distribution assemblies may have orifices with orifice diameters of 1.2 mm while one or more other sidewall gas distribution assemblies in same the chamber may have orifice diameters of 1.5 mm. One or more sidewall gas distribution assemblies may have orifices with different orifice orientations compared to one or more other sidewall gas distribution assemblies where the orifices direct process gases at different angles.

Referring to FIG. 1, the one or more process gases introduced from the sidewall gas distribution assemblies 150 and 160 may react with the nitrogen containing gas from the gas distribution showerhead 106 to form a film (e.g., GaN, AlN, AlGaN etc.) on one or more substrates 116 that are supported by the susceptor 114. Other reaction products, such as nitrogen and chlorine, are exhausted through an exhaust 126. The substrate 116 may be any suitable single crystalline substrate upon which a film such as gallium nitride (GaN) single crystalline film may be formed. Examples of suitable substrates 116 may include a sapphire (Al2O3) substrate, a silicon carbide (SiC) substrate, a silicon on diamond (SOD) substrate, a quartz (SiO2) substrate, a glass substrate, a zinc oxide (ZnO) substrate, a magnesium oxide (MgO) substrate and a lithium aluminum oxide (LiAlO2) substrate.

Figure 5C:
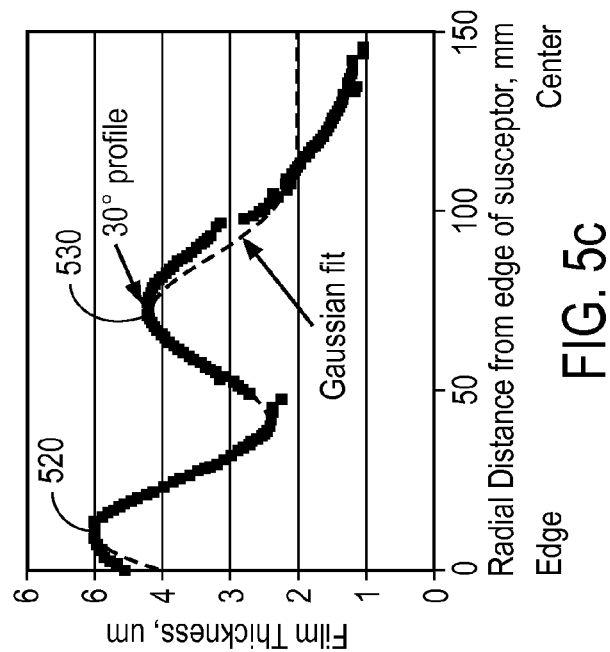
FIGS. 5a, 5b, and 5c are graphs of different radial film thickness distributions corresponding to sidewall gas distribution assemblies with different orifice characteristics in accordance with one embodiment.
Figure 5A:
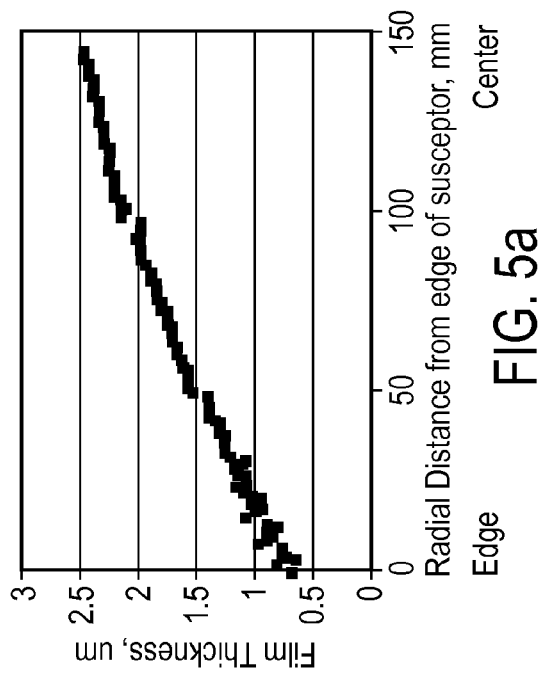
Figure 5B:
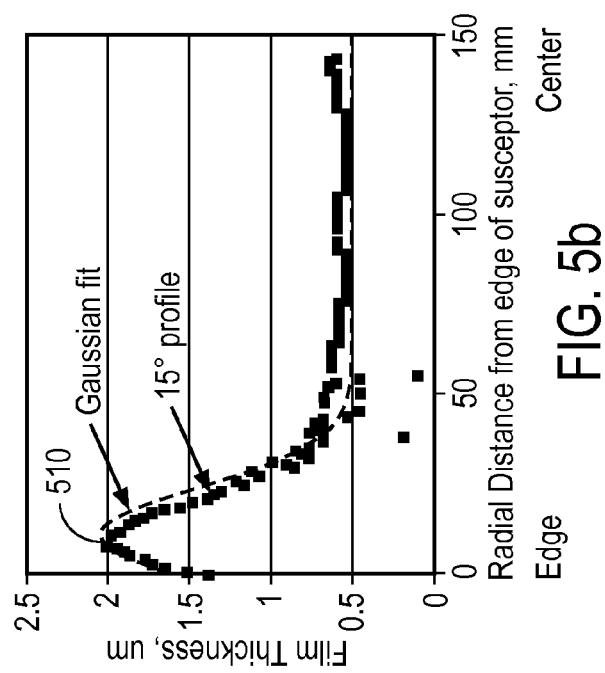

Depositing a film with a uniform thickness distribution across the susceptor requires the processing apparatus to have a uniform radial film growth rates profile across the susceptor. The radial film growth rate profile of a sidewall gas distribution assembly may be strongly dependent on the orifice characteristics of the sidewall gas distribution assemblies. In particular, the orifice orientation and the angles at which the orifices direct process gases into the chamber may greatly affect the film growth rate profile across the susceptor. FIGS. 5a, 5b, and 5c show the radial thickness distributions across the susceptor for a film deposited by flowing gas through at least one sidewall gas distribution assembly at different orifice orientations according to one embodiment. The sidewall gas distribution assembly that produces the thickness distribution in FIG. 5a has 48 orifices that direct process gases into the chamber at an angle 420 of 90 degrees (i.e., parallel to the susceptor). The linear radial film thickness distribution in FIG. 5a increases approximately linearly from the edge to the center of the susceptor and suggests a source depletion mechanism during film deposition that is related to the main recirculating flow of process gases in a direction parallel to the susceptor. In FIGS. 5b and 5c, different radial thickness distributions are achieved using a second sidewall gas distribution assembly in addition to the sidewall gas distribution assembly used in FIG. 5a. The second sidewall gas distribution assembly for FIG. 5b has 48 orifices that direct process gases at an angle of 15 degrees. In FIG. 5c, the second sidewall gas distribution assembly has 60 orifices with half of the orifices directing process gases at an angle of 15 degrees and the other half of the orifices directing process gases at an angle of 30 degrees. The peaks 510, 520, 530 shown in the radial film thickness distributions of FIGS. 5b and 5c suggest the existence of another film growth mechanism that is related to the direct jetting of the process gases onto the susceptor surface. Each of the peaks 510, 520, and 530 in the radial film thickness distributions from FIGS. 5b and 5c corresponds to a specific angle at which process gases are directed towards the susceptor surface by the orifices. The peaks 510 and 520 correspond to the angle of 15 degrees while the peak 530 corresponds to the angle of 30 degrees. Each peak follows a Gaussian distribution.

Figure 6:
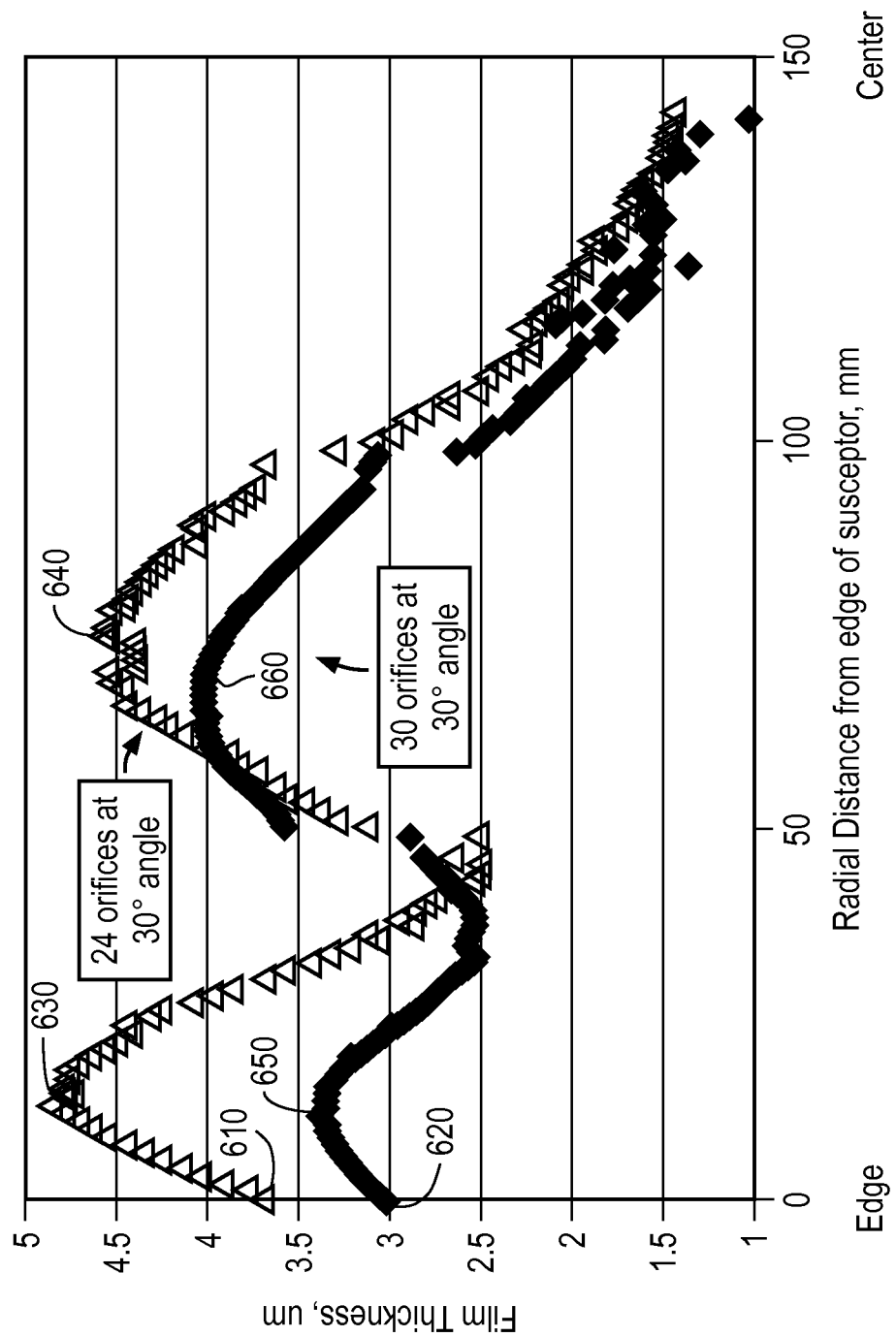
FIG. 6 is a graph of different radial film thickness distributions corresponding to sidewall gas distribution assemblies with different orifice characteristics in accordance with one embodiment.

The relative heights of the peaks may depend on the relative number of orifices directing gases at each of the angles. FIG. 6 shows different radial film thickness distributions corresponding to different sidewall gas distribution assemblies with different proportion of orifices directing gases at 15 degrees versus 30 degrees according to one embodiment. The sidewall gas distribution assembly that produces the radial film thickness distribution 610 has a greater proportion of orifices directing process gases at an angle of 30 degrees versus 15 degrees compared to the sidewall gas distribution assembly that produces the radial thickness distribution 620. Increasing the proportion of orifices that direct process gases at an angle of 30 degrees increases the relative height of the 30 degree angle peak 640 compared to the 15 degree angle peak 630.

Figure 7A:
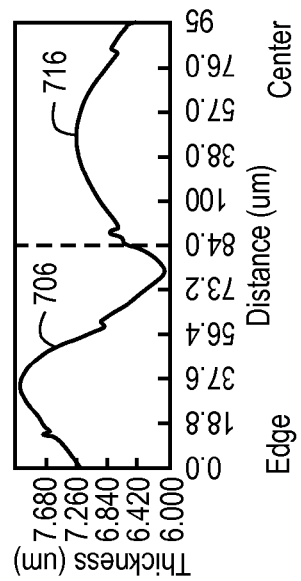
FIGS. 7a, 7b, and 7c are graphs of different radial film thickness distributions corresponding to different gas flow rates through the gas distribution showerhead in accordance with one embodiment.
Figure 7B:
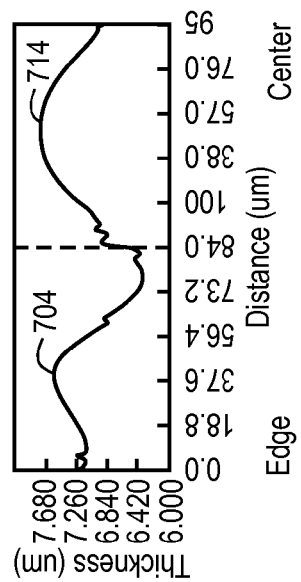
Figure 7C:
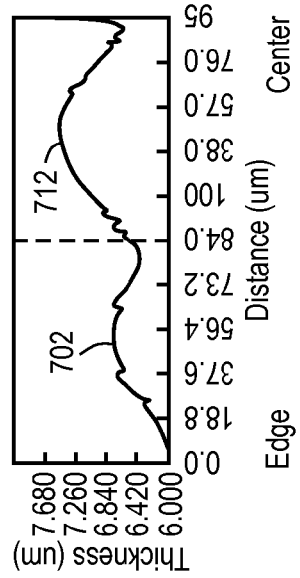

The radial film thickness distribution may also be tuned by adjusting the gas flow rate through the gas distribution showerhead 106. FIGS. 7a, 7b, and 7c show according to one embodiment, how the radial film thickness distribution associated with a sidewall gas distribution assembly changes with an increase in the flow rate of nitrogen containing gas and inert gas through the gas distribution showerhead 106 while maintaining a constant ratio of nitrogen containing gas and inert gas. As the gas flow rate through the gas distribution showerhead increases from 27 standard liters/minute (slm) in FIGS. 7a to 32 slm in FIGS. 7b to 40 slm in FIG. 7c, the height of the peaks 702, 704, 706, which are closer to the edge of the susceptor increase relative to the peaks 712, 714, 716, which are closer to the center of the susceptor. FIGS. 7a, 7b, and 7c suggest that the film growth rate associated with jetting process gases towards the edge of the susceptor by the orifices on the sidewall gas distribution assembly increases with an increase in the gas flow rate through the gas distribution showerhead.

Figure 8:
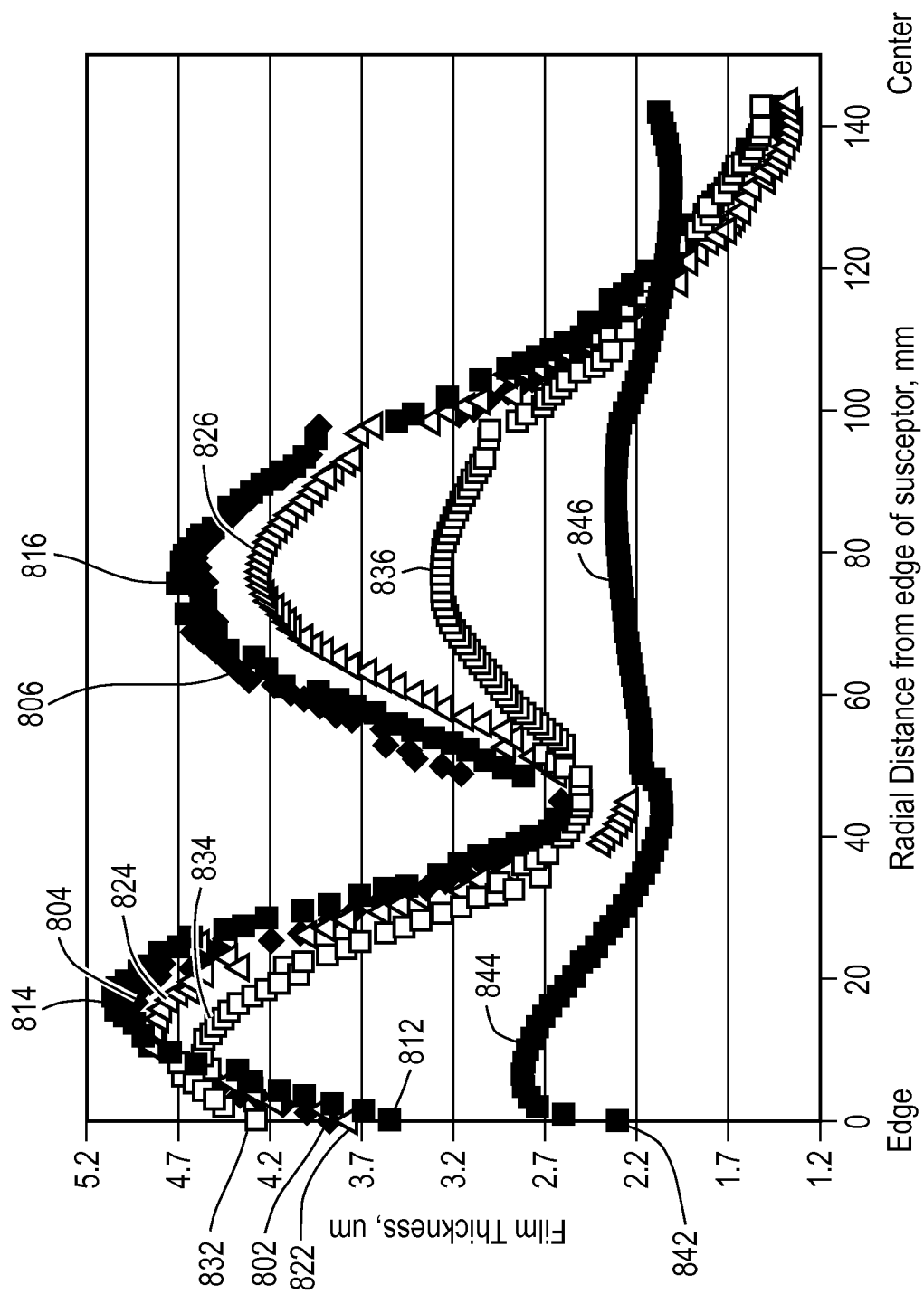
FIG. 8 is a graph of different radial film thickness distributions corresponding to different process gas flow rates through one of the sidewall gas distribution assemblies in a chamber in accordance with one embodiment.

The radial film thickness distributions may also be tunable by adjusting gas flow rate conditions through the sidewall gas distribution assemblies. FIG. 8 illustrates a graph of radial film thickness distributions 802, 812, 822, 832, and 842 across a susceptor that are produced by the same sidewall gas distribution assemblies as in FIG. 5c according to one embodiment. FIG. 8 shows that increasing the diatomic nitrogen flow rate through the second gas distribution assembly increases the overall film growth rate and increases the height of the peaks 804, 814, 824, 834, 844, which are closer to the center of the susceptor (30 degree angle) relative to the peaks 806, 816, 826, 836, 846, which are closer to the edge of the susceptor (15 degree angle). The diatomic nitrogen flow rates through the second sidewall gas distribution assembly that correspond to the radial film thickness distributions 802, 812, 822, 832, 842 are 12 slm, 16 slm, 20 slm, 23.4 slm, 26 slm respectively. FIG. 8 shows that increasing the gas flow rate through the sidewall gas distribution assembly increases the film growth rate corresponding to the jetting of process gases at a 30 degree angle relative to the film growth rate corresponding to the jetting of process gases at a 15 degree angle.

The orifice characteristics of the sidewall gas distribution assemblies may be designed such that the film growth rate profile produced by one sidewall gas distribution assembly complements the film growth rate profiles produced by one or more other sidewall gas distribution assemblies. The resultant combined film growth rate profile for all the sidewall gas distribution assemblies may be approximately uniform across the susceptor. For example, the chamber may contain two sidewall gas distribution assemblies where one sidewall gas distribution assembly may have orifice characteristics that produce a center-fast film growth rate profile similar to FIG. 9a and the other sidewall gas distribution assembly may have orifice characteristics that produce a complementary edge-fast film growth rate profile similar to FIG. 9b. The net combined film growth rate profile from operating both sidewall gas distribution assemblies may then be approximately uniform across the susceptor.

Figure 9B:
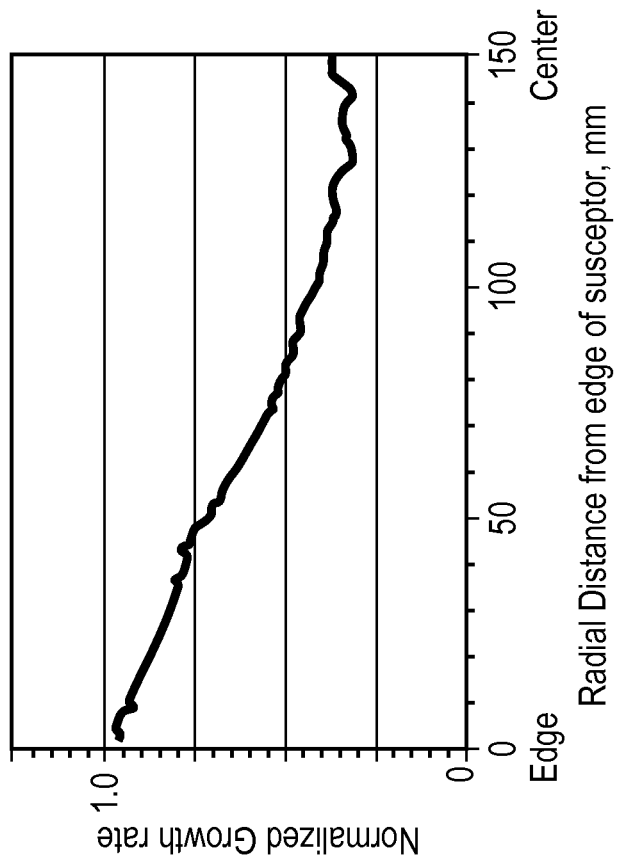
FIGS. 9a and 9b are graphs of complementary film thickness distributions produced by complementary sidewall gas distribution assemblies in accordance with one embodiment.
Figure 9A:
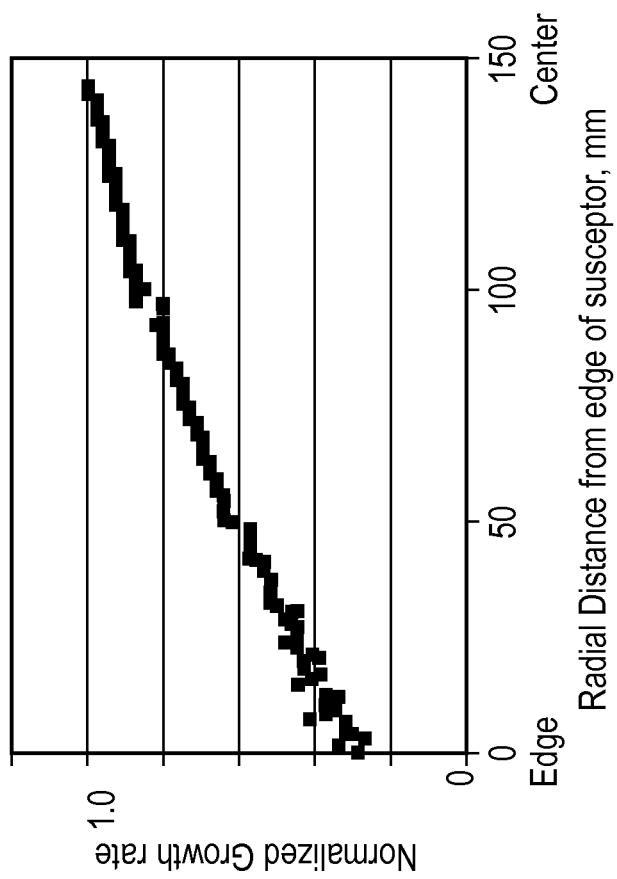
Figure 10A:
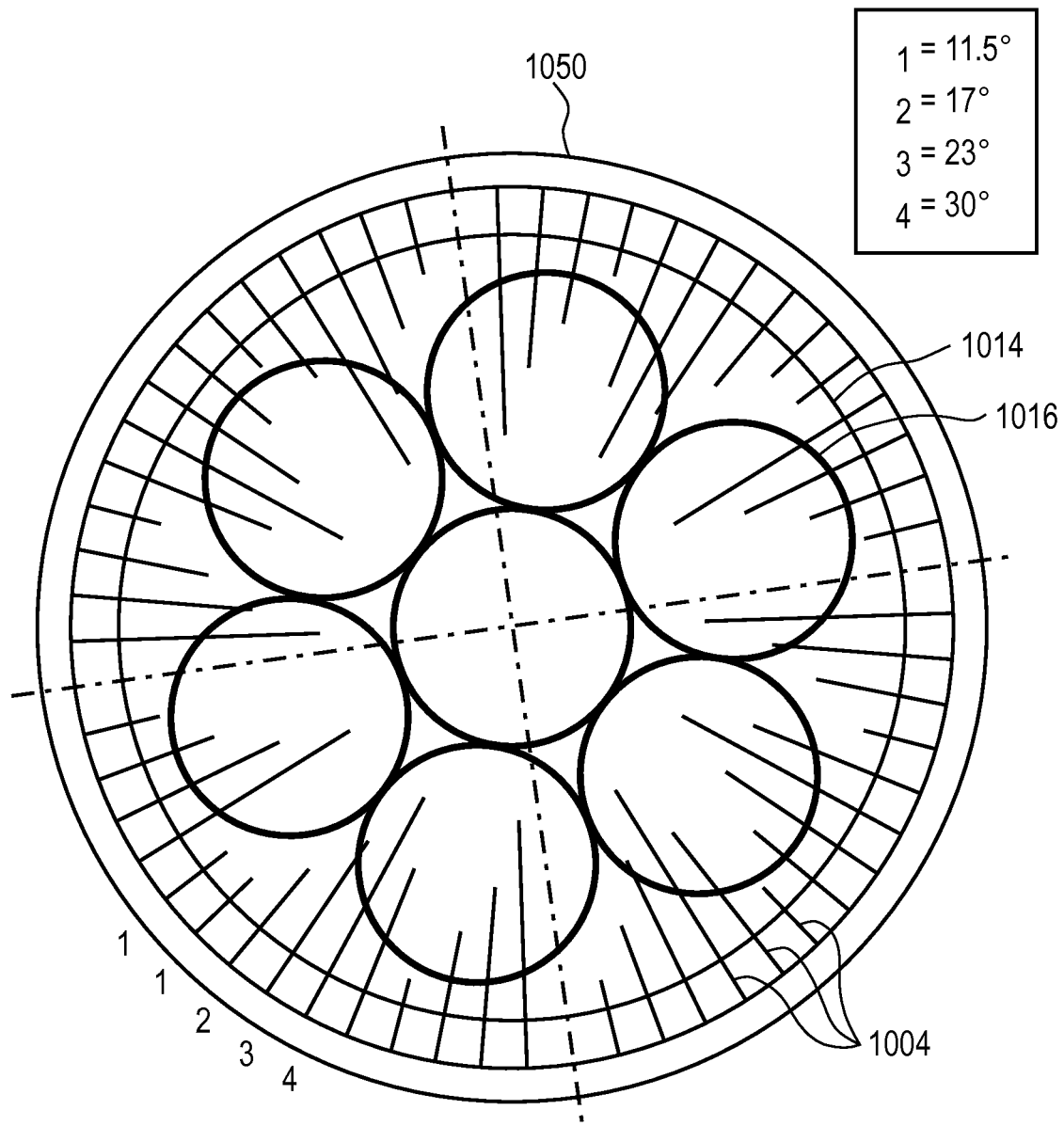
FIG. 10a illustrates the top view of a sidewall gas distribution assembly that produces an edge-fast linear film growth rate profile in accordance with one embodiment.
Figure 10B:
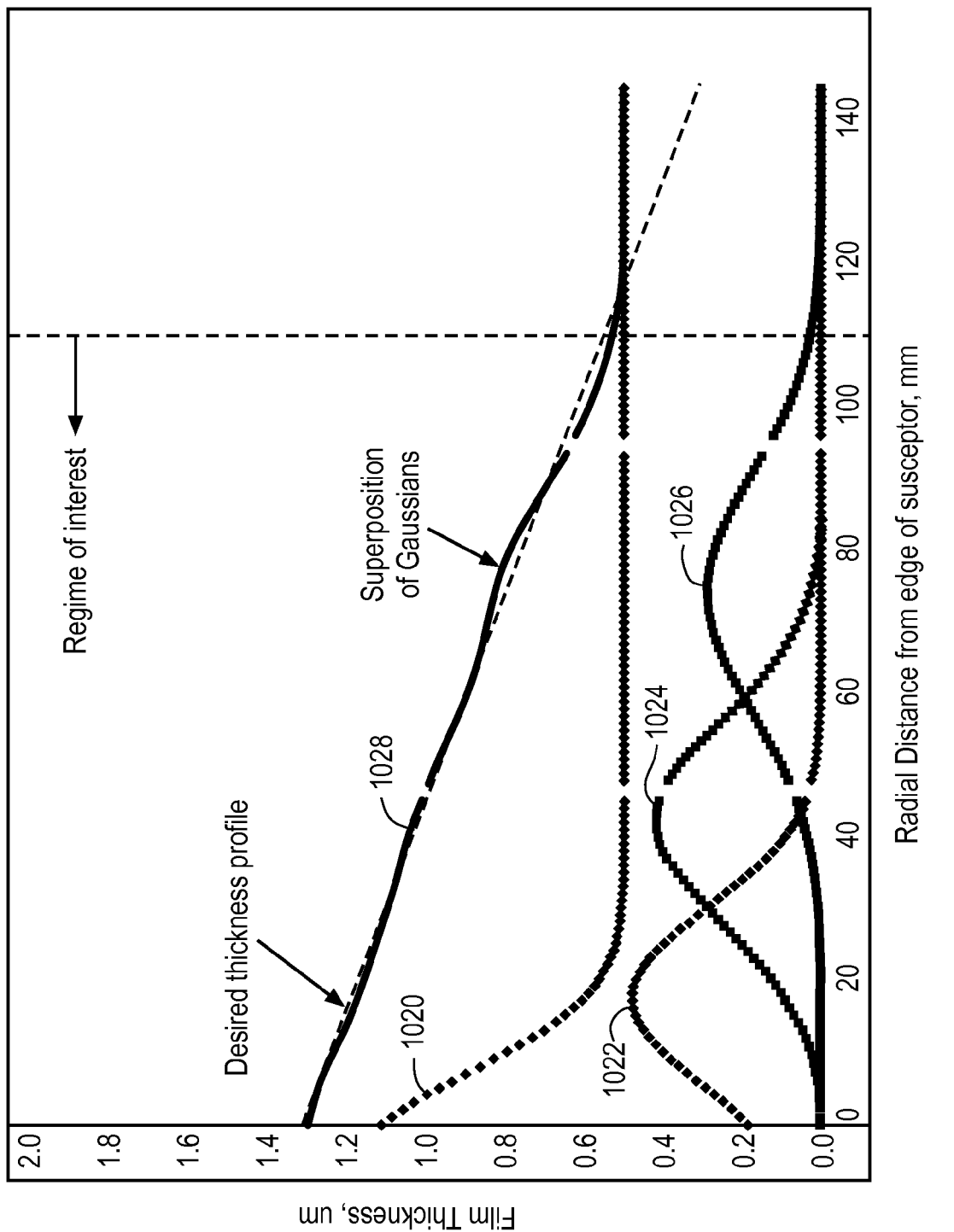
FIG. 10b shows according to one embodiment, the 4 different Gaussian peaks 1020, 1022, 1024, 1026 in the film thickness distribution that may be produced by the sidewall gas distribution assembly 1050.

In one embodiment, a process apparatus may contain two sidewall gas distribution assemblies having complementary film growth rate profiles similar to FIGS. 9a and 9b. One sidewall gas distribution assembly may have 48 uniformly distributed orifices with orifice diameters of 1.5 mm and with orifice orientations that direct process gases at an angle of 90 degrees to produce a linear film growth rate profile that is center-fast. The other sidewall gas distribution assembly 1050 may have 60 uniformly distributed orifices with orifice diameters of 1.2 mm and with four different orifice orientations directing process gases at four different angles as illustrated in FIG. 10a according to one embodiment. FIG. 10a illustrates a combination of orifice orientations that may produce the edge-fast linear film growth rate profile in FIG. 9b in one embodiment. The sidewall gas distribution assembly 1050 in FIG. 10a has 4 different orifice orientations where the process gases are directed at angles of 11.5, 17, 23, and 30 degrees according to one embodiment. The sidewall gas distribution assembly 1050 has 18 orifices directing process gases at an angle of 11.5 degrees, 15 orifices directing process gases at an angle of 17 degrees, 15 orifices directing process gases at an angle of 23 degrees, and 12 orifices directing process gases at an angle of 30 degrees. The orifices on the sidewall distribution assembly 1050 have orifice orientations according to the sequence 1002. Process gases flow from the orifices along different paths 1004 towards the susceptor 1014 corresponding to the different orifice orientations. FIG. 10b shows according to one embodiment, the 4 different Gaussian peaks 1020, 1022, 1024, 1026 in the film thickness distribution that may be produced by the sidewall gas distribution assembly 1050 with the four different orifice orientations discussed above. The 4 Gaussian peaks may overlap to form a linear film thickness distribution 1028 that decreases from the edge to the center of the susceptor 1014. The table below shows the within-substrate film thickness uniformities achieved by a processing apparatus with the two complementary sidewall gas distribution assemblies described above. Based on the results from the table below the expected within-chamber 1-sigma film thickness uniformity produced by the two complementary sidewall gas distribution assemblies described above is 1.5%.

| Radial Position of Substrate on Susceptor | 1-sigma % Uniformity |
|---|---|
| Outer | 2.26 |
| Middle | 1.47 |
| Inner | 1.71 |

Figure 11:
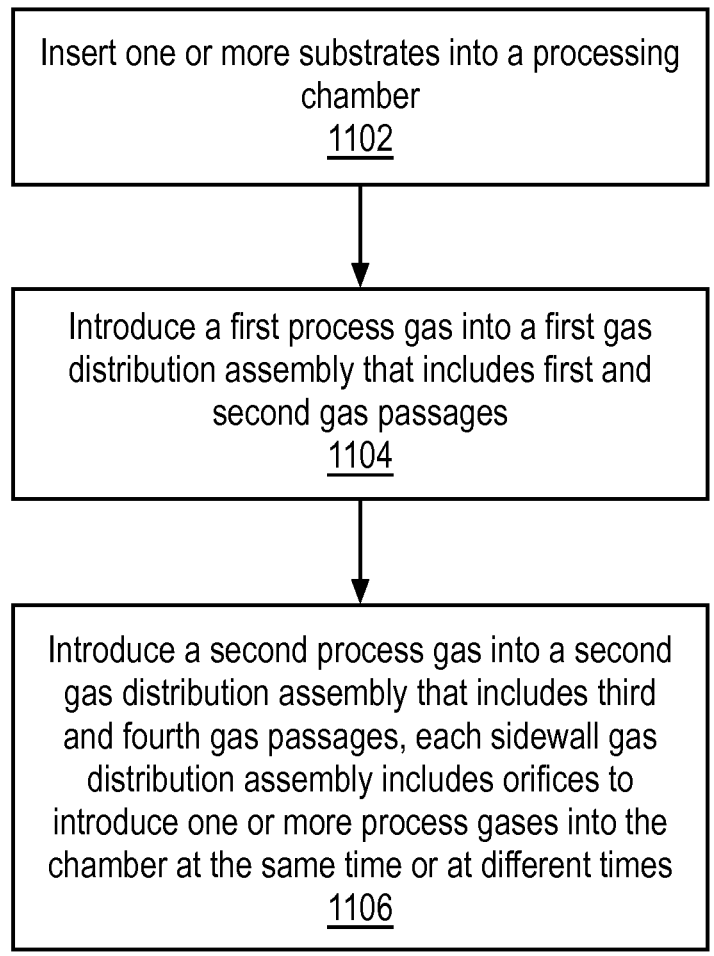
FIG. 11 is a flowchart illustrating a processing method (e.g., an HVPE processing method, a hot wall chemical vapor deposition method) in accordance with one embodiment.

FIG. 11 is a flowchart that illustrates a computer-implemented method for depositing a film using a processing chamber (e.g., a HVPE chamber, a hot-wall chemical vapor deposition chamber). The method may be performed by processing logic that may comprise hardware (e.g., circuitry, dedicated logic, programmable logic, microcode, etc.), software (such as instructions run on a processing device), or a combination thereof. In one embodiment, some or all of operations of the computer implemented method 100 are performed by the processing logic in combination with the processing apparatus. Alternatively, one or more operations are performed manually.

In one embodiment, one or more substrates are inserted into a processing chamber (e.g., a HVPE processing chamber, a hot-wall chemical vapor deposition apparatus) at block 1102. The substrates may be supported by the susceptor. The lamp module may be turned on to heat the substrate and correspondingly the chamber. A nitrogen containing reactive gas may be introduced from a gas source into the processing chamber. The nitrogen containing gas may pass through an energy source such as a gas heater to bring the nitrogen containing gas into a more reactive state. The nitrogen containing gas then passes through the chamber lid and the gas distribution showerhead.

One or more process gases (e.g., metal halides, GaCl, GaCl3, AlCl, AlCl3, AlBr3, AlI, AlI3, diatomic nitrogen, helium, argon, etc.) may be introduced into the processing chamber through two or more sidewall gas distribution assemblies. For example, a first processing gas may be introduced into a first sidewall gas distribution assembly that includes a first gas passage and a second gas passage at block 1104. A second processing gas may be introduced into a second sidewall gas distribution assembly that includes a third gas passage and a fourth gas passage at block 1106. The first and second gas distribution assemblies are each adapted to be coupled to the processing chamber. In one embodiment, the second gas passage and the fourth gas passage each include orifices to introduce the first and second process gases respectively into the processing chamber.

Each of the sidewall gas distribution assemblies in the processing apparatus may be controlled independently and be operated at different conditions. A subset of sidewall gas distribution assemblies may be operated at any one time or by varying the process gas flow through each sidewall gas distribution assembly during processing. The one or more process gases may be introduced into the processing chamber sequentially through each sidewall gas distribution assembly at different times. Alternatively, the one or more process gases may be introduced into the processing chamber at the same time through the simultaneous operation of the sidewall gas distribution assemblies. The process gases introduced by the sidewall gas distribution assemblies may be one of or a combination of reactive gases or inert gases. Due to the thermal gradient within the chamber, the process gases and the nitrogen containing gas may intermix by rising and falling within the processing chamber and react together to form a film (e.g., GaN, AlN, AlGaN) that is deposited on one or more substrates. The gaseous reaction may produces gaseous by-products such as chloride and nitrogen containing compounds which may be evacuated out of the chamber thought the exhaust.

While the nitrogen containing gas is discussed as being introduced through the gas distribution showerhead and one or more other process gases are delivered through the sidewall gas distribution assemblies, it is to be understood that the locations of gas introduction may be reversed. However, if the other process gases (e.g., metal halides, GaCl, GaCl3, AlCl, AlCl3, AlBr3, AlI, AlI3, diatomic nitrogen, helium, argon, etc.) are introduced through the showerhead, the showerhead may be heated to increase the reactiveness of the process gases.

Additionally, the deposition process may involve depositing a thin film (e.g. AlN, Al-containing III-nitride) as a seed layer over the one or more substrates 116 followed by another subsequent film (e.g., p-GaN, n-GaN, u-GaN, AlN, AlGaN). Both the seed layer and the subsequent film may be deposited within the same processing chamber. Thereafter, the substrates may be removed and placed into an MOCVD processing chamber where yet another layer may be deposited. In some embodiments, the seed layer may be eliminated. The HVPE apparatus 100 and the MOCVD apparatus may be used in a processing system which includes a cluster tool that is adapted to process substrates and analyze the results of the processes performed on the substrate.

Figure 12:
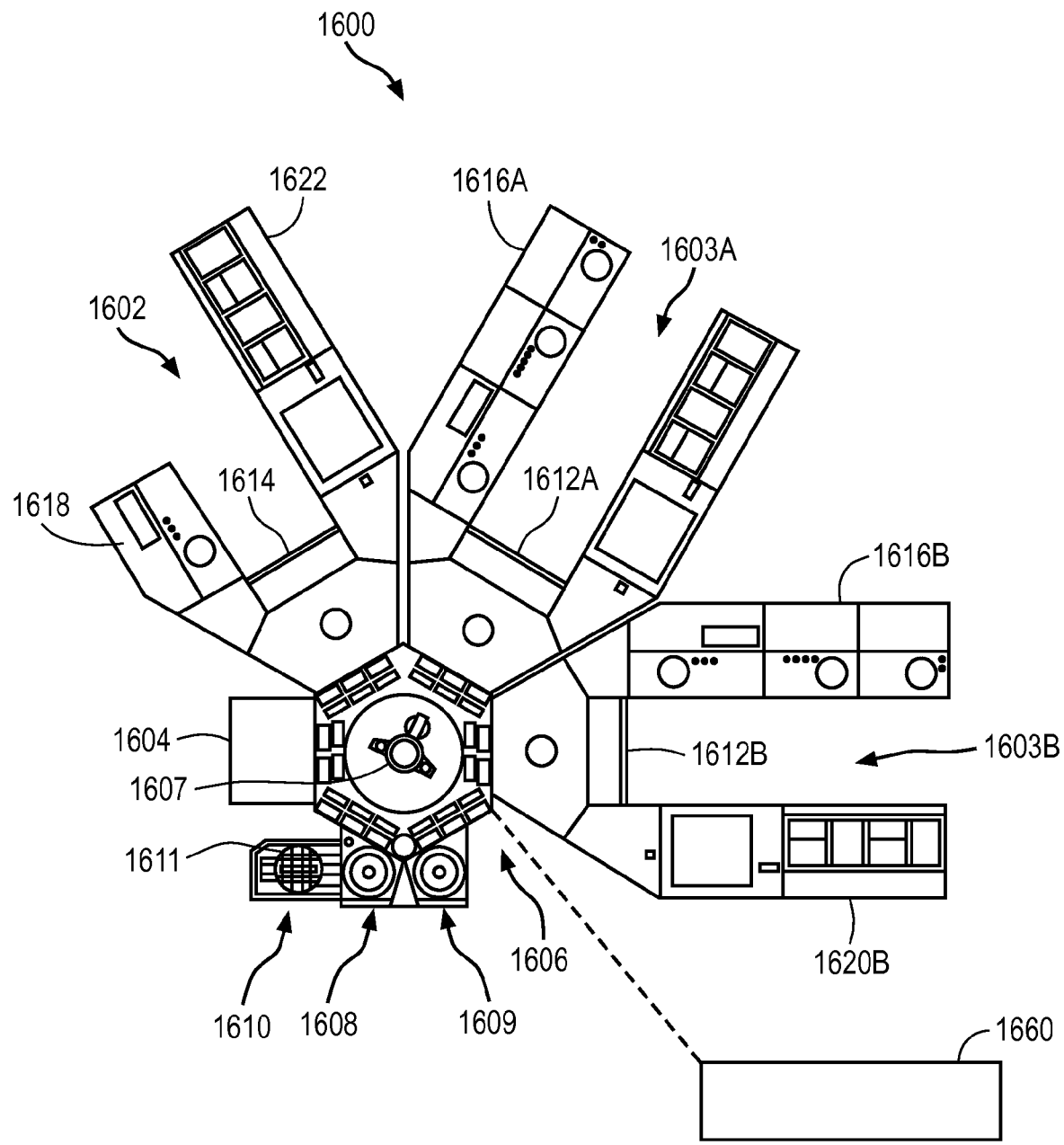
FIG. 12 illustrates a physical structure of a cluster tool schematically in accordance with one embodiment.

The physical structure of the cluster tool is illustrated schematically in FIG. 12 in one embodiment. One or more substrates may be provided in a chamber first to form a group III-nitride layer, and then move to a different chamber within a tool for subsequent processing. In one embodiment, the cluster tool 1600 includes one HVPE chamber 1602 and multiple MOCVD chambers 1603a and 1603b connected to a transfer chamber 1606 for fabricating compound nitride semiconductor devices according to embodiments described herein. Although one HVPE chamber 1602 and two MOCVD chambers 1603a and 1603b are shown, it should be understood that any combination of one or more MOCVD chambers with one or more HVPE chambers may also be coupled with the transfer chamber 1606. For example, in one embodiment, the cluster tool 1600 may include 3 MOCVD chambers. It should also be understood that although a cluster tool is shown, the embodiments described herein may also be performed using a linear processing system.

In one embodiment, an additional chamber 1604 is coupled with the transfer chamber 1606. The additional chamber 1604 may be an MOCVD chamber, an HVPE chamber, a metrology chamber, a degassing chamber, an orientation chamber, a cool down chamber, a pretreatment/preclean chamber, a post-anneal chamber, or the like. In one embodiment, the transfer chamber 1606 is six-sided and hexagonal in shape with six positions for process chamber mounting. In another embodiment, the transfer chamber 1606 may have other shapes and have five, seven, eight, or more sides with a corresponding number of process chamber mounting positions.

The HVPE chamber 1602 is adapted to perform HVPE processes in which gaseous metal halides are used to epitaxially grow layers of compound nitride semiconductor materials on heated substrates. The HVPE chamber 1602 includes a chamber body 1614 where a substrate is placed to undergo processing, a chemical delivery module 1618 from which gas precursors are delivered to the chamber body 1614, and an electrical module 1622 that includes the electrical system for the HVPE chamber of the cluster tool 1600. In one embodiment, the HVPE chamber 1602 may be similar to the HVPE apparatus 600 described in FIG. 7.

Each MOCVD chamber 1603a, 1603b includes a chamber body 1612a, 1612b forming a processing region where a substrate is placed to undergo processing, a chemical delivery module 1616a, 1616b from which gases such as precursors, purge gases, and cleaning gases are delivered to the chamber body 1612a, 1612b and an electrical module 1620a, 1620b for each MOCVD chamber 1603a, 1603b that includes the electrical system for each MOCVD chamber of the cluster tool 1600. Each MOCVD chamber 1603a, 1603b is adapted to perform CVD processes in which metalorganic precursors (e.g., TMG, TMA) react with metal hydride elements to form layers of compound nitride semiconductor materials.

The cluster tool 1600 further includes a robot assembly 1607 housed in the transfer chamber 1606, a load lock chamber 1608 coupled with the transfer chamber 1606, a batch load lock chamber 1609, for storing substrates, coupled with the transfer chamber 1606. The cluster tool 1600 further includes a load station 1610, for loading substrates, coupled with the load lock chamber 1608. The robot assembly 1607 is operable to pick up and transfer substrates between the load lock chamber 1608, the batch load lock chamber 1609, the HVPE chamber 1602, and the MOCVD chambers 1603a, 1603b. In one embodiment, the load station 1610 is an automatic loading station configured to load substrates from cassettes to substrate carriers or to the load lock chamber 1608 directly, and to unload the substrates from substrate carriers or from the load lock chamber 1608 to cassettes.

The transfer chamber 1606 may remain under vacuum and/or at a pressure below atmosphere during the process. The vacuum level of the transfer chamber 1606 may be adjusted to match the vacuum level of corresponding processing chambers. In one embodiment, the transfer chamber 1606 maintains an environment having greater than 90% N2 for substrate transfer. In another embodiment, the transfer chamber 1606 maintains an environment of high purity NH3 for substrate transfer. In one embodiment, the substrate is transferred in an environment having greater than 90% NH3. In another embodiment, the transfer chamber 1606 maintains an environment of high purity H2 for substrate transfer. In one embodiment, the substrate is transferred in an environment having greater than 90% H2.

The cluster tool 1600 further includes a system controller 1660 which controls activities and operating parameters. The system controller 1660 includes a computer processor and a computer-readable memory coupled to the processor. The processor executes system control software, such as a computer program stored in memory.

In one embodiment, one of the processing chamber 1602, 1603a, 1603b, or 1604 is configured to form a group III-nitride layer prior to forming device structures. The group III-nitride layer or several group III-nitride layers deposited on substrates are then transferred to one or more deposition chambers to deposit the subsequent layers used to form the device structures. The structure permits the transfers to be effected in a defined ambient environment, including under vacuum, in the presence of a selected gas, under defined temperature conditions, and the like. The cluster tool is a modular system including multiple chambers that perform various processing operations that are used to form an electronic device. The cluster tool may be any platform known in the art that is capable of adaptively controlling a plurality of process modules simultaneously. Exemplary embodiments include an Opus™ AdvantEdge™ system or a Centura™ system, both commercially available from Applied Materials, Inc. of Santa Clara, Calif.

For a single chamber process, layers of differing composition are grown successively as different operations of a growth recipe executed within the single chamber. For a multiple chamber process, layers in a III-V or II-VI structure are grown in a sequence of separate chambers. For example, an undoped/nGaN layer may be grown in a first chamber, a MQW structure grown in a second chamber, and a pGaN layer grown in a third chamber.

Figure 13:
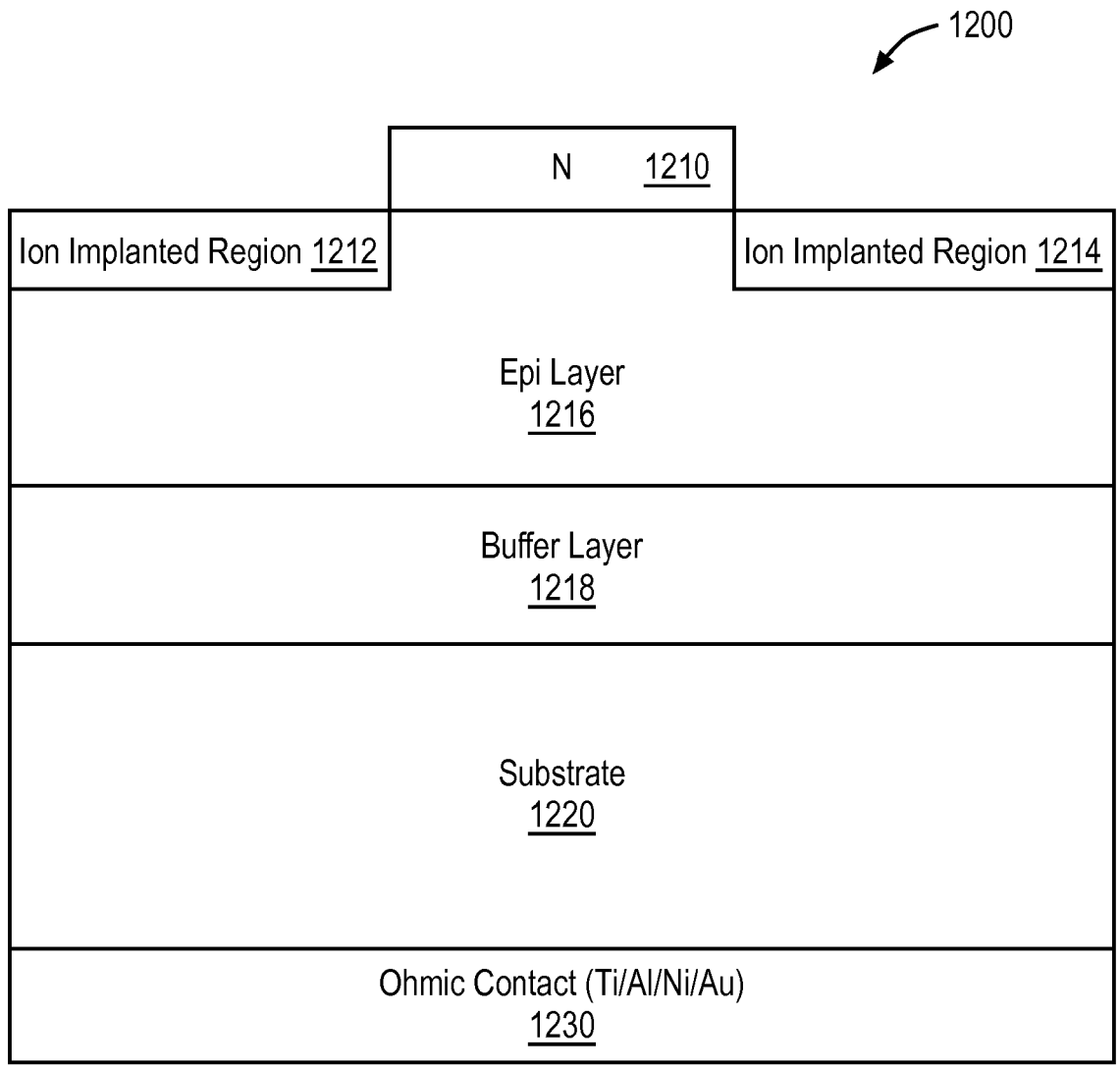
FIG. 13 illustrates a cross-sectional view of a device in accordance with one embodiment.

FIG. 13 illustrates a cross-sectional view of a power electronics device in accordance with one embodiment. The power electronic device 1200 may include an N type region 1210 (e.g., electrode), ion implanted regions 1212 and 1214, an epitaxial layer 1216 (e.g., N type GaN epi layer with a thickness of 4 microns), a buffer layer (e.g., N+GaN buffer layer with a thickness of 2 microns), a substrate 1220 (e.g., N+bulk GaN substrate, silicon substrate), and an ohmic contact (e.g., Ti/Al/Ni/Au). The device 1200 may include one or more layers of GaN disposed on a GaN substrate or a silicon substrate. The device (e.g., power IC, power diode, power thyristor, power MOSFET, IGBT, GaN HEMT transistor) may be used for switches or rectifiers in power electronics circuits and modules.

Figure 14:
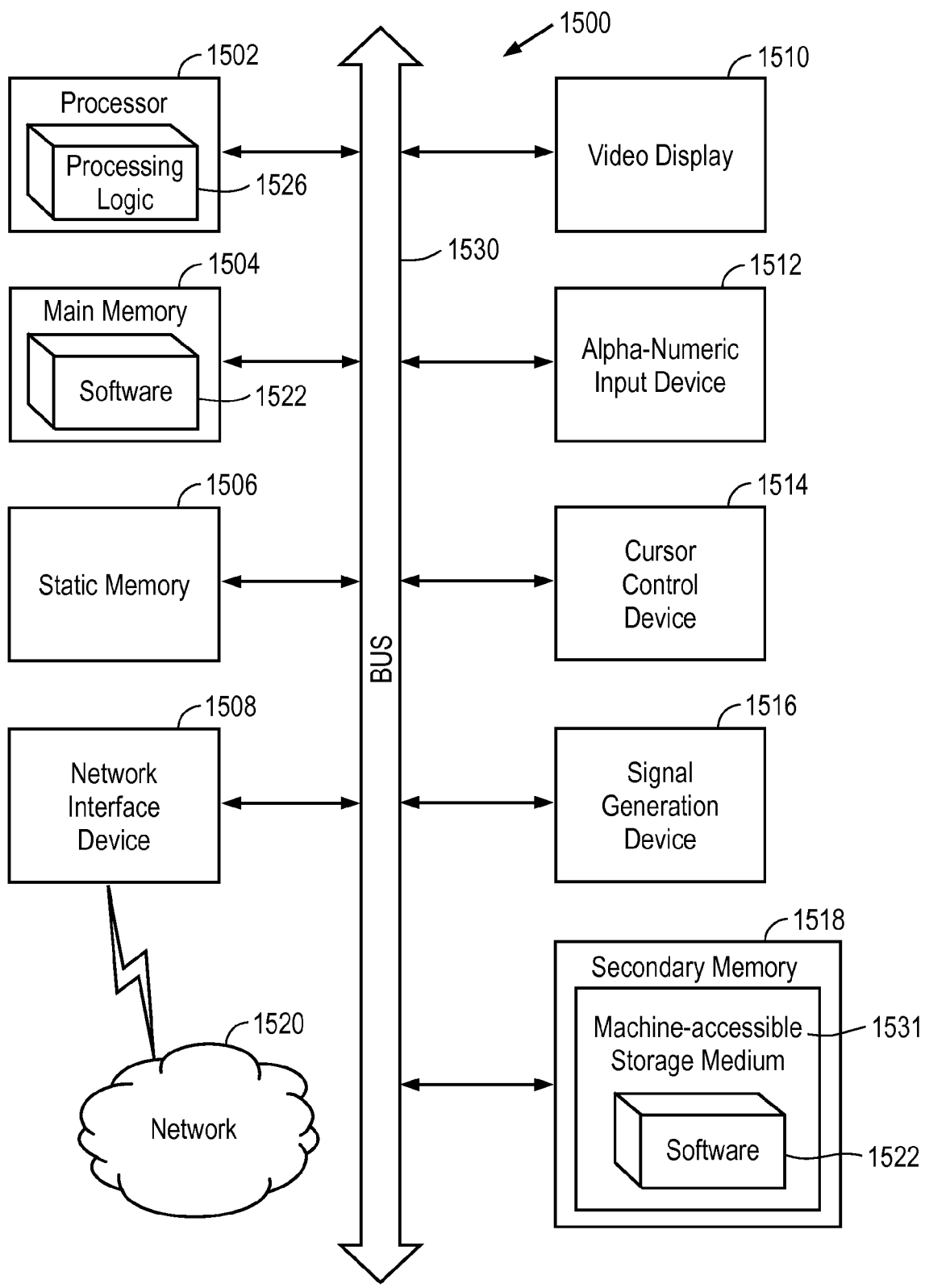
FIG. 14 illustrates a diagrammatic representation of a machine in the exemplary form of a computer system 1500 within which a set of instructions, for causing the machine to perform any one or more of the methodologies discussed herein, may be executed.

FIG. 14 illustrates a diagrammatic representation of a machine in the exemplary form of a computer system 1500 within which a set of instructions, for causing the machine to perform any one or more of the methodologies discussed herein, may be executed. The machine may be part of a system controller (e.g., 161) or coupled to the system controller. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies discussed herein.

The exemplary computer system 1500 includes a processor 1502, a main memory 1504 (e.g., read-only memory (ROM), flash memory, dynamic random access memory (DRAM) such as synchronous DRAM (SDRAM) or Rambus DRAM (RDRAM), etc.), a static memory 1506 (e.g., flash memory, static random access memory (SRAM), etc.), and a secondary memory 1518 (e.g., a data storage device), which communicate with each other via a bus 1530.

Processor 1502 represents one or more general-purpose processing devices such as a microprocessor, central processing unit, or the like. More particularly, the processor 1502 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 1502 may also be one or more special-purpose processing devices such as an application specific integrated circuit (ASIC), a field programmable gate array (FPGA), a digital signal processor (DSP), network processor, or the like. Processor 1502 is configured to execute the processing logic 1526 for performing the operations (e.g., ICM operations) discussed herein.

The computer system 1500 may further include a network interface device 1508. The computer system 1500 also may include a video display unit 1510 (e.g., a liquid crystal display (LCD) or a cathode ray tube (CRT)), an alphanumeric input device 1512 (e.g., a keyboard), a cursor control device 1514 (e.g., a mouse), and a signal generation device 1516 (e.g., a speaker).

The secondary memory 1518 may include a machine-readable storage medium (or more specifically a computer-readable storage medium) 1531 on which is stored one or more sets of instructions (e.g., software 1522) embodying any one or more of the methodologies or functions described herein. The software 1522 may also reside, completely or at least partially, within the main memory 1504 and/or within the processing device 1502 during execution thereof by the computer system 1500, the main memory 1504 and the processing device 1502 also constituting machine-readable storage media. The software 1522 may further be transmitted or received over a network 1520 via the network interface device 1508.

While the machine-readable storage medium 1531 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

It is to be understood that the above description is intended to be illustrative, and not restrictive. Many other embodiments will be apparent to those of skill in the art upon reading and understanding the above description. Although the present disclosure has been described with reference to specific exemplary embodiments, it will be recognized that the invention is not limited to the embodiments described, but can be practiced with modification and alteration. Accordingly, the specification and drawings are to be regarded in an illustrative sense rather than a restrictive sense.

What is claimed is:

1. An apparatus, comprising:
   a first gas distribution assembly that includes a first gas passage for introducing a first process gas into a second gas passage that introduces the first process gas into a processing chamber; and
   a second gas distribution assembly that includes a third gas passage for introducing a second process gas into a fourth gas passage that introduces the second process gas into the processing chamber, wherein the first and second gas distribution assemblies are each adapted to be coupled to at least one chamber wall of a processing chamber, wherein the second gas passage and the fourth gas passage each include a plurality of orifices to introduce the first and second process gases into the processing chamber, wherein the first gas passage is shaped as a first annular ring within the processing chamber at a first height above the second gas passage that is shaped as a second annular ring for uniform distribution of the first process gas at a different second height within the processing chamber, wherein the third gas passage is positioned within the processing chamber at a third different height below the first height of the first gas passage and above the second height of the second gas passage.

2. The apparatus of claim 1, wherein the first gas passage is coupled to the second gas passage and the third gas passage is coupled to the fourth gas passage.

3. The apparatus of claim 1, wherein the first gas distribution assembly has a different number of orifices than the second gas distribution assembly, wherein the first gas distribution assembly has a first set of uniformly distributed orifices with a first orifice diameter and with orifice orientations that direct process gases at an angle of 90 degrees to produce a linear film growth rate profile that is a center-fast film growth profile, wherein the second gas distribution assembly has a second set of uniformly distributed orifices with a second orifice diameter and with four different orifice orientations arranged in a plurality of sequences of orifice orientations.

4. The apparatus of claim 2, wherein the orifices of the first gas distribution assembly have different orifice diameters than the orifices of the second gas distribution assembly.

5. The apparatus of claim 2, wherein the orifices of the first and second gas distribution assemblies have orifice orientations that direct process gases into the processing chamber at a plurality of different angles.

6. The apparatus of claim 1, further comprising:
   a third gas distribution assembly that includes a fifth gas passage and a sixth gas passage.

7. The apparatus of claim 2, wherein the orifices of first gas distribution assembly have orifice orientations that direct process gases into the processing chamber at an angle that is parallel to a susceptor, and wherein the orifices of the second gas distribution assembly have orifice orientations that direct process gases into the chamber at a plurality of different angles.

8. The apparatus of claim 2, wherein each gas distribution assembly has a radial growth rate profile during process deposition that is dependent on the orifice characteristics of each respective gas distribution assembly's orifices.

9. The apparatus of claim 1, wherein the first gas distribution assembly has a first characteristic radial film growth rate profile having a faster growth rate near a center of the susceptor and the second gas distribution assembly has a second characteristic radial film growth rate profile having a faster growth rate near an edge of the susceptor to complement each other to produce a net uniform radial growth rate profile.

10. The apparatus of claim 1, wherein each gas distribution assembly is adapted to be coupled to a chamber wall of the processing chamber.

11. A method comprising:
    introducing a first process gas into a first sidewall gas distribution assembly that includes a first gas passage and a second gas passage; and
    introducing a second process gas into a second sidewall gas distribution assembly that includes a third gas passage and a fourth gas passage, wherein the first and second sidewall gas distribution assemblies are each adapted to be coupled to at least one chamber wall of a processing chamber, wherein the second gas passage and the fourth gas passage each include a plurality of orifices to introduce the first and second process gases respectively into the processing chamber, wherein the first sidewall gas distribution assembly has a first characteristic radial film growth rate profile having a faster growth rate near a center of a susceptor of the processing chamber and the second sidewall gas distribution assembly has a second characteristic radial film growth rate profile having a faster growth rate near an edge of the susceptor to complement each other to produce a net uniform radial growth rate profile.

12. The method of claim 11, wherein the first sidewall gas distribution assembly introduces the first process gas into the processing chamber followed subsequently by the second sidewall gas distribution assembly introducing the second process gas into the processing chamber.

13. The method of claim 11, wherein the first and second sidewall gas distribution assemblies introduce process gases into the chamber simultaneously.

14. The method of claim 11, wherein the first process gas comprises a reactive gas and the second process gas comprises an inert gas.

15. The method of claim 11, wherein the first characteristic radial film growth rate profile across the susceptor of the processing chamber is dependent on the first gas distribution assembly's orifice characteristics.

16. The method of claim 15, further comprising rotating the susceptor during processing, wherein the resultant growth rate profiles of each gas distribution assembly have some radial symmetry and wherein the growth rate profiles of each gas distribution assembly complement each other to produce a net uniform growth rate profile across the susceptor.

17. An apparatus, comprising:
a first sidewall gas distribution assembly that includes a first plurality of orifices to introduce one or more process gases into a processing chamber; and
a second sidewall gas distribution assembly that includes a second plurality of orifices to introduce one or more process gases into the processing chamber, wherein the first and second gas distribution assemblies are each adapted to be coupled to at least one chamber wall of the processing chamber, wherein the first sidewall gas distribution assembly has a first characteristic radial film growth rate profile having a faster growth rate near a center of a susceptor of the processing chamber and the second sidewall gas distribution assembly has a second characteristic radial film growth rate profile having a faster growth rate near an edge of the susceptor to complement each other to produce a net uniform radial growth rate profile.

18. The apparatus of claim 17, wherein the first plurality of orifices of the first sidewall gas distribution assembly has a different number of orifices than the second plurality of orifices of the second sidewall gas distribution assembly.

19. The apparatus of claim 17, wherein the first characteristic radial film growth rate profile during process deposition is dependent on the first gas distribution assembly's orifice characteristics.

* * * * *